United States Patent
Murray (10) Patent No.: US 6,710,618 B1
(45) Date of Patent: Mar. 23, 2004

(54) PROGRAMMABLE ON-CHIP TERMINATION DEVICE

(75) Inventor: Kenelm G. Murray, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/136,111

(22) Filed: May 1, 2002

(51) Int. Cl.[7] .................. H03K 19/003; H03H 7/38
(52) U.S. Cl. ................... 326/30; 326/86; 333/17.3
(58) Field of Search ................ 326/30, 83, 86; 333/17.3, 124, 32

(56) References Cited

U.S. PATENT DOCUMENTS 6,424,169 B1 * 7/2002 Partow et al. ................ 326/30
6,509,765 B1 * 1/2003 Drost .......................... 327/112
6,545,522 B2 * 4/2003 Mughal et al. ............. 327/334
6,552,565 B2 * 4/2003 Chang et al. ................ 326/30

FOREIGN PATENT DOCUMENTS

JP 03212701 A * 9/1991 .......... G05B/11/16

* cited by examiner

Primary Examiner—James H Cho
(74) Attorney, Agent, or Firm—Marger Johnson & McCollom, P.C.

(57) ABSTRACT

The present invention is a method and apparatus for producing a programmable on-chip resistance. A programmable on-chip resistance is maintained to provide a constant resistance for differential input common mode voltage changes and may provide a constant resistance over changes in an amplitude of an input differential swing. The programmable on-chip resistance may be implemented through a single transistor in which a control voltage for altering the resistance of the transistor is produced by the use of an intermediate termination device. The intermediate termination device may replicate the programmable on-chip termination device to ensure proper adjustment of the on-chip termination device to maintain a constant resistance.

21 Claims, 8 Drawing Sheets

PROGRAMMABLE ON-CHIP TERMINATION DEVICE

FIELD OF THE INVENTION

The present invention relates generally to on-chip termination resistors and more specifically to a programmable on-chip termination device.

BACKGROUND OF THE INVENTION

The Low Voltage Differential Swing (LVDS) standard provides a data interface that has a balanced I/O buffer driver that sends data by current signaling in a balanced interconnect environment. LVDS is adapted for high-speed transmission of binary data over copper. An advantageous aspect of LVDS is provided due to the response of LVDS receivers to differential voltages, thus LVDS receivers are fairly immune to noise and emit less electromagnetic interference (EMI) than other data transmission standards.

A problem associated with LVDS compliant interfaces is a requirement of a precise line termination resistance. A line termination resistance, fabricated according to various methods, is typically placed in front of a LVDS receiver to maintain signal quality and integrity. LVDS circuits must provide buffers to ensure a signal current of typically 4.0 milliAmperes on a voltage drop across the on-chip resistance of typically 400 millivolts. In order to provide a resistor termination to an LVDS transmission line that does not suffer symmetrical signal distortion, an on-chip resistance must be of a chosen value and remain within a desired tolerance. The chosen value for the termination resistor may be required to be between 50 Ohms and 150 Ohms to suit the characteristic impedance of the media with a tolerance of ±10%. However, due to temperature and technology variations, an on-chip resistance may vary as much as 30%. Consequently, a programmable on-chip resistance capable of providing an adjustable resistance while accommodating process and temperature variation is desirable.

SUMMARY OF THE INVENTION

Accordingly, the present invention is directed to a method and apparatus for producing a programmable on-chip resistance. In an embodiment of the invention, a programmable on-chip resistance is maintained to provide a constant resistance for differential input common mode voltage changes. Further, a programmable on-chip termination device may provide a constant resistance over changes in an amplitude of an input differential swing. The programmable on-chip resistance may be implemented through a single transistor in which a control voltage for altering the resistance of the transistor is produced by the use of an intermediate termination device. The intermediate termination device may replicate the programmable on-chip termination device to ensure proper adjustment to maintain a constant resistance.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made to a presently preferred embodiments of the invention, examples of which are illustrated in the accompanying drawings.

Figure 1:
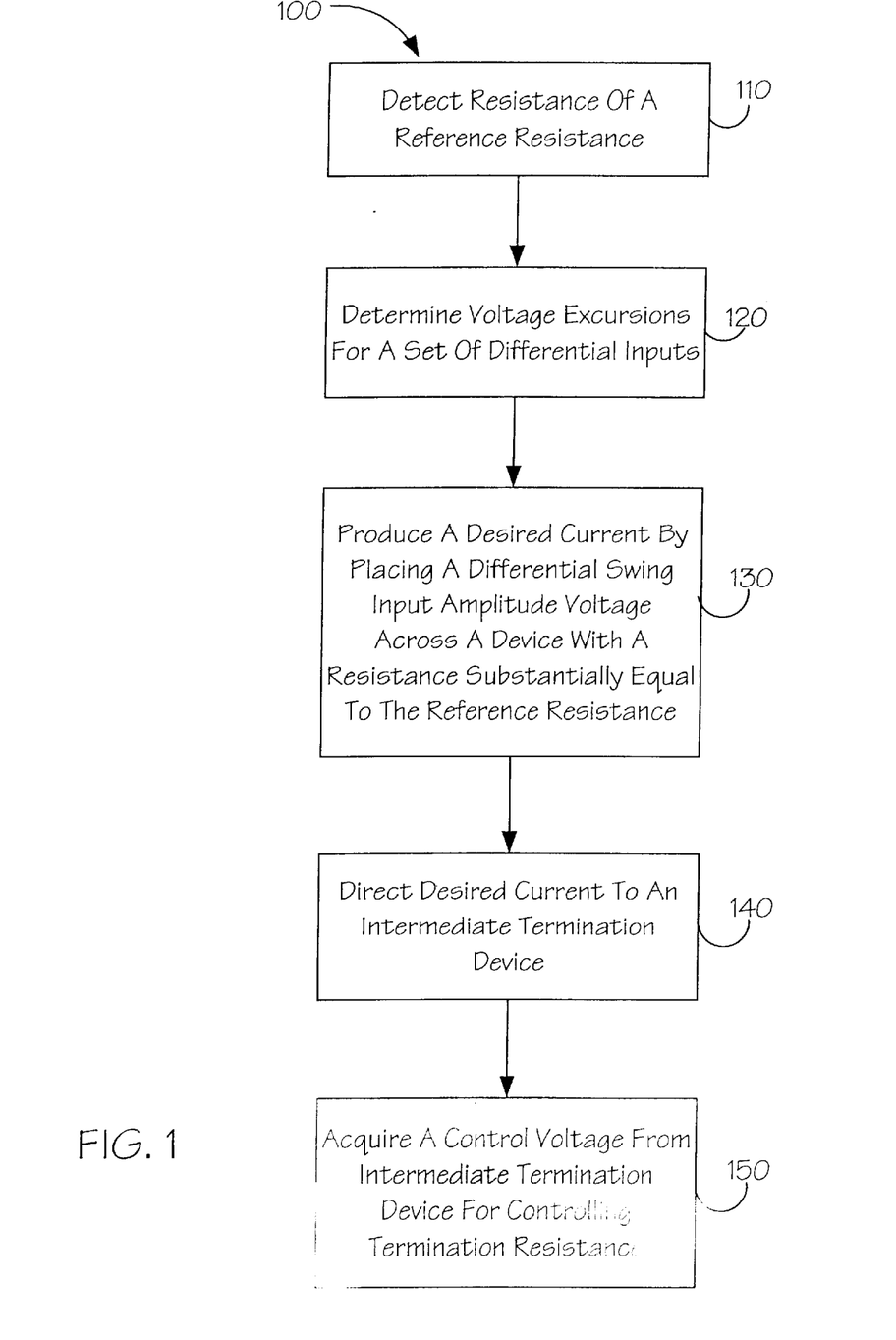
FIG. 1 depicts an exemplary process for producing a programmable on-chip resistance according to an embodiment of the present invention.

Referring to FIG. 1, an exemplary process 100 for producing a programmable on-chip resistance according to an embodiment of the present invention is shown. In one embodiment, process 100 may produce a desirable on-chip resistance. In one embodiment of the invention, the on-chip resistance may be substantially equal to the resistance of a reference resistance, such as a resistor located off the chip. In alternative embodiments, reference resistance may be produced by various devices such as transistors and may be placed off the chip, on the chip, and in the same package as the circuitry for the present invention. Process 100 may begin by detecting the resistance of a reference resistance 110. This may be accomplished in many ways including the measuring of a current through a reference resistance generated by a known voltage.

Process 100 may be utilized to provide a termination resistance for differential inputs of a LVDS compliant interface. A set of differential inputs may be monitored to determine a positive and negative voltage excursion of the set of differential inputs 120. The negative voltage excursion may be subtracted from the positive voltage excursion to produce a differential input swing amplitude voltage. A desired current may be produced by placing the differential input swing amplitude voltage across a device with a resistance substantially equal to the reference resistance 130. The device may be the resistance replicated on the chip, or in an alternative embodiment, may be the reference resistance itself. The desired current produced through the reference resistance may be directed, or in an alternative embodiment manipulated, and fed to an intermediate termination device 140.

The intermediate termination device may receive the desired current and the positive and negative voltage excursions to produce a control voltage. A control voltage, acquired from the intermediate termination device, may be utilized to control the resistance of a termination resistance or a programmable resistance device for the differential inputs 150. The resistance produced by the programmable resistance device may be substantially equal to the resistance of the reference resistance, located, for example off the chip. In one embodiment of the invention, the programmable resistance device may be a transistor.

Figure 2:
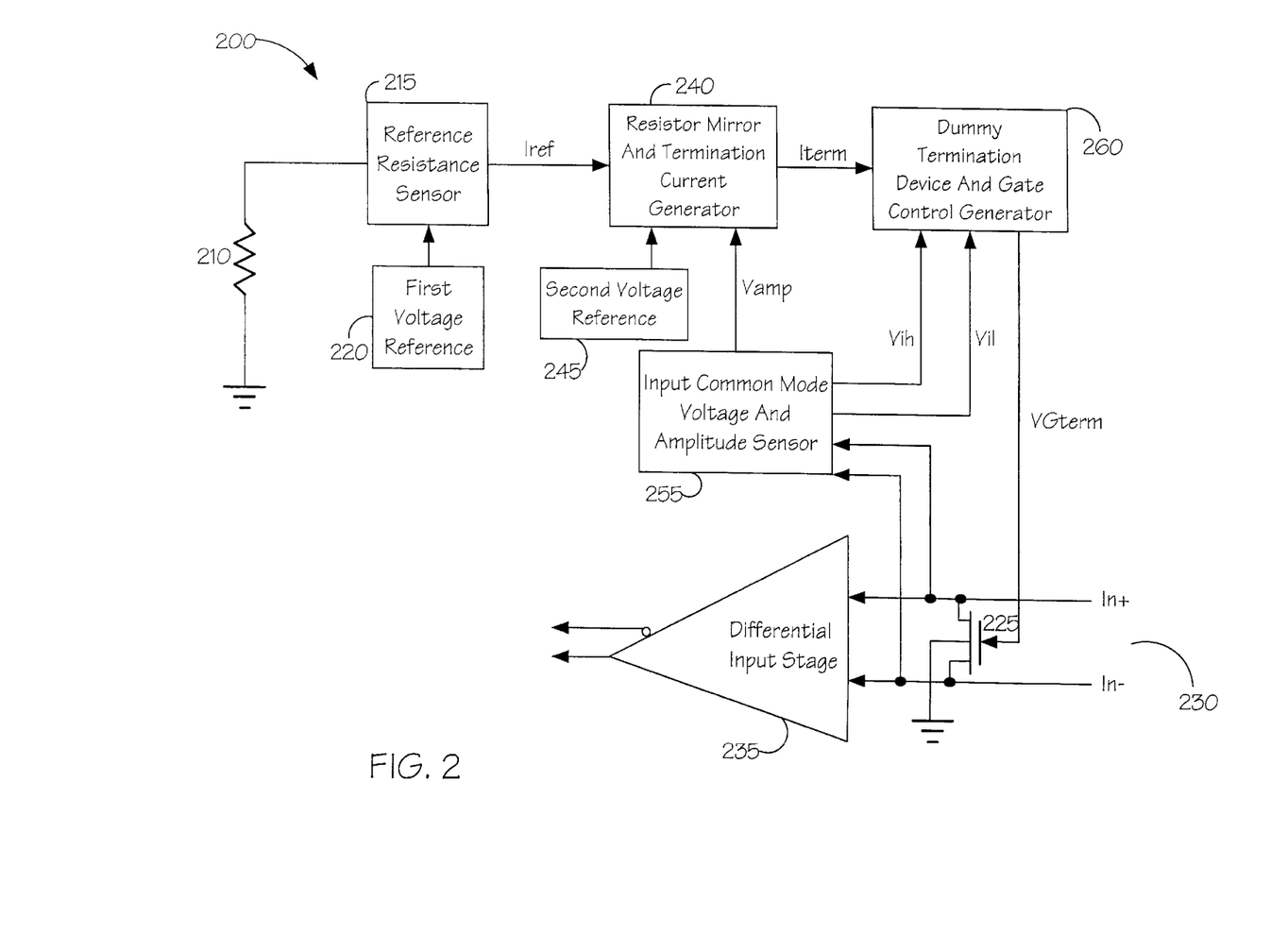
FIG. 2 depicts an exemplary embodiment of the apparatus of the present invention for producing a programmable on-chip resistance.

Referring now to FIG. 2, an exemplary embodiment of an apparatus 200 for providing a programmable on-chip resistance in accordance with the present invention is shown. In one embodiment of the invention, apparatus 200 may perform process 100 of FIG. 1 to provide a programmable on-chip termination resistance. Apparatus 200 may include an external reference resistance sensor 215 that may detect the resistance of a reference resistance 210. Reference resistance 210 may be a highly precise resistor with a minimal tolerance. Further, reference resistance 210 may have a nominal value selected to match the termination requirements of a variety of transmission media with a set of different characteristic impedances. Reference resistance sensor 215 may establish a voltage from a first voltage reference 220 across the reference resistance 210 to provide a reference current (Iref in FIG. 2). It should be understood by those with ordinary skill in the art that reference resistance 210 may be produced in various fashions and various methods of detecting the resistance of reference resistance 210 by a reference resistance sensor 215 may be employed without departing from the scope and spirit of the present invention.

Current Iref may be delivered to resistor mirror termination current generator 240. Resistor mirror termination current generator 240 may produce a current (Itermn on FIG. 2) from a second voltage reference 245 and a voltage named Vamp produced from an input common mode voltage and amplitude sensor 255. A dummy termination device and gate control generator 260 may provide a voltage reference control (VGterm in FIG. 2) for transistor 225 that provides a termination resistance for differential inputs 230.

Dummy termination device and gate control generator 260 has current Iterm from resistor mirror termination current generator 240 applied through the device and receives a detected high and low extreme voltage levels (Vih and Vil on FIG. 2) of the external differential inputs. The current Itern may be reflective of the resistance of reference resistance 210. Dummy termination device 260 may be an example of an intermediate termination device of FIG. 1. A resistance of approximately the same value as reference resistance may be produced by transistor 225 between the differential inputs 230 and differential input stage 235. In one embodiment of the invention, the termination resistance is implemented with a programmable resistance device, such as a single n channel MOS transistor with an analog gate control. This may be advantageous as this may minimize the parasitic capacitance as seen by a high-speed driver sending data to the differential input ports. Apparatus 200 may employ current sources to transport resistor information across device dimensions. This may be advantageous as current sources may be less prone to noise effects than voltage bias schemes.

Another advantageous aspect of an embodiment of the apparatus 200 for providing a programmable on-chip resistance is the ability to implement an analog scheme. Digital schemes known to the art using multiple selectable devices as switches heavily load a high-speed network. However, an analog scheme may not require any special high-speed performance and may provide ease in implementation with regard to amplifier stability and over-voltage generation. Further, an analog scheme may not require specialized accurate control of an input termination resistance and may allow for ease of implementation with regard to on-chip component mismatch and input offsets.

Figure 3:
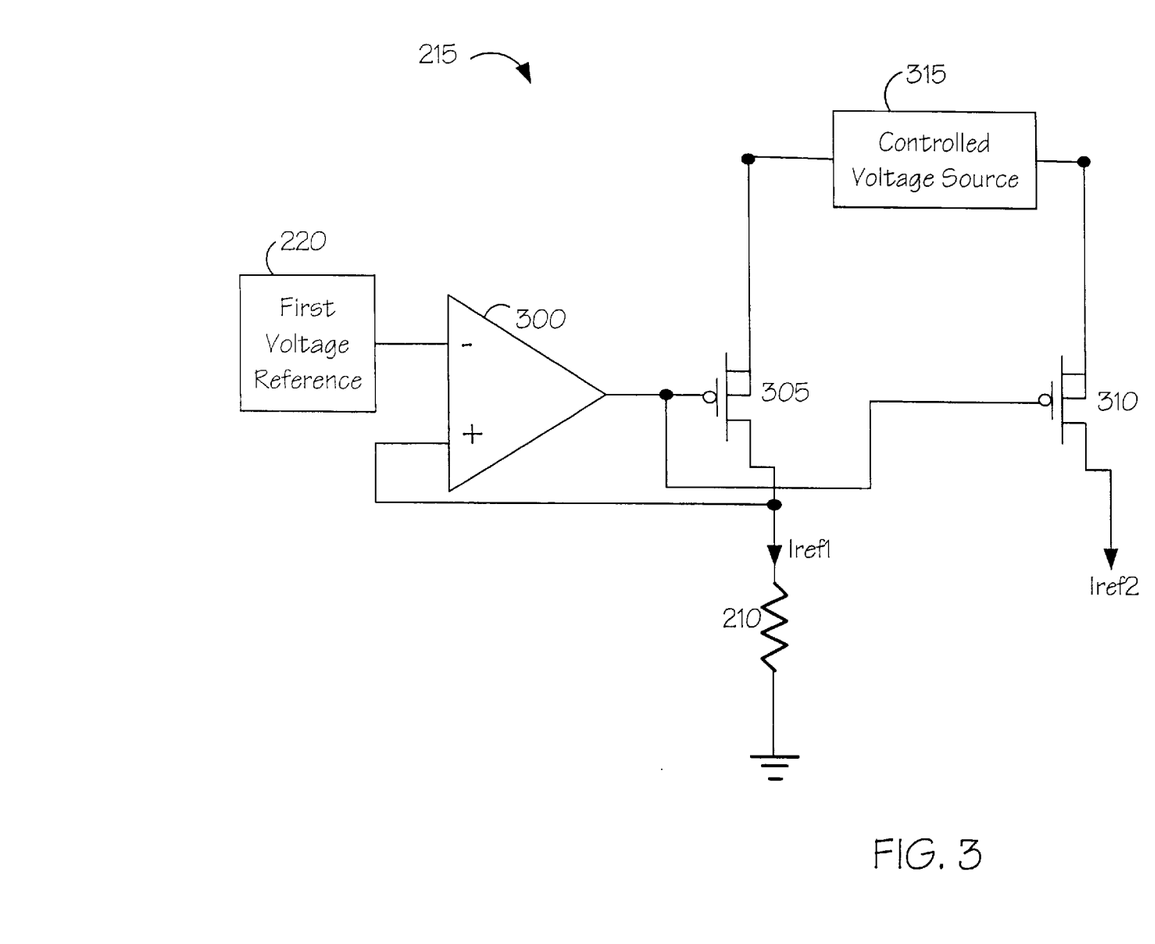
FIG. 3 depicts an exemplary embodiment of an external reference resistance of the present invention.

Referring to FIG. 3, an exemplary embodiment of a reference resistance sensor 215 of the present invention is shown. Reference resistance sensor 215 may employ an amplifier 300 that utilizes a first voltage reference 220 to obtain a measure of current (Iref1 on FIG. 2) from the drain of transistor 305. Current Iref1 may be mirrored from transistor 305 to transistor 310 to produce a current Iref2. In one embodiment of the invention, Iref2 may be routed across the apparatus 200 to the vicinity of the differential input stage 235 of FIG. 2. A controlled voltage source 315 may be coupled to transistors 305 and 310. Controlled voltage source 315 may be a value of VCC, approximately 2.5 volts. In one embodiment of the invention, transistors 305 and 310 are p-channel MOS devices. In an alternative embodiments, n channel MOS devices, CMOS devices, and bipolar junction transistors may be employed in accordance with the reference resistance sensor 215 of the present invention to produce a current Iref2. It should be understood by those with ordinary skill in the art that other types of reference resistance sensors may be employed to detect the resistance of a resistor or other type of device without departing from the scope and spirit of the present invention.

Figure 4A:
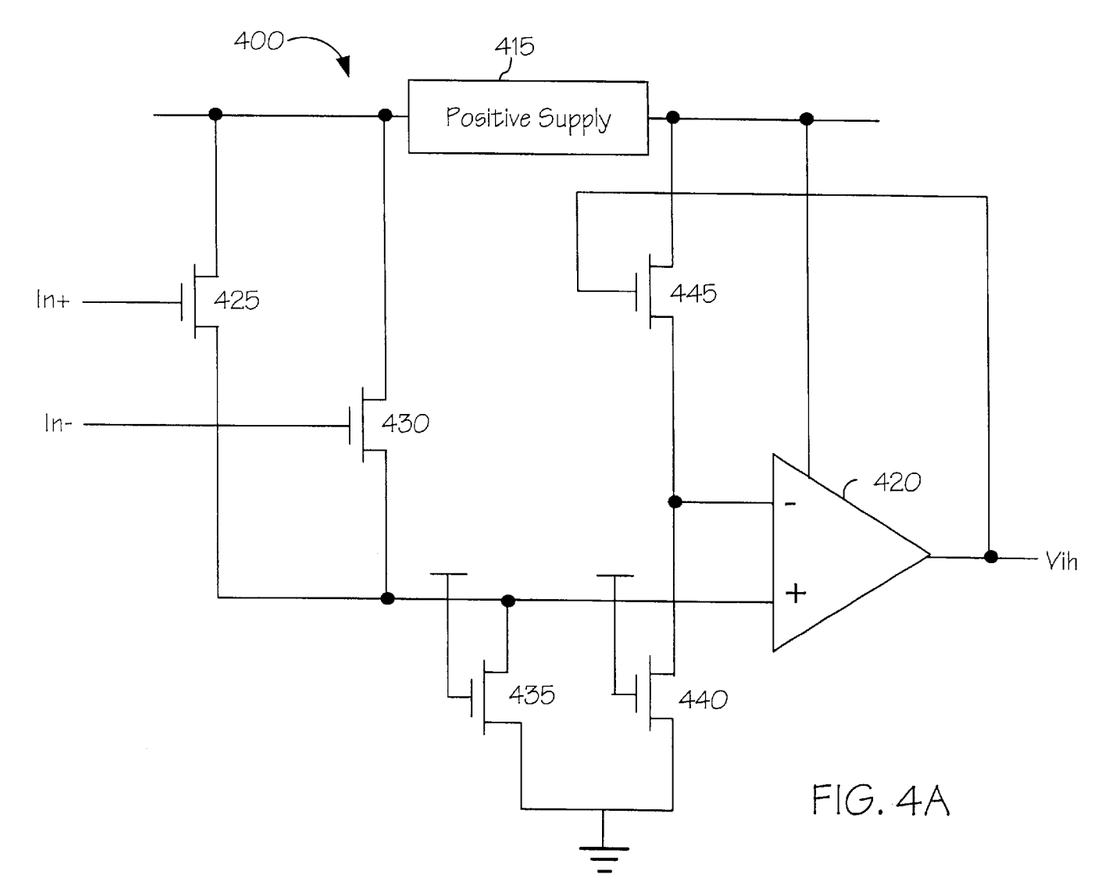
FIG. 4A depicts an exemplary embodiment of circuitry for producing a positive voltage excursion in accordance with the present invention.
Figure 4B:
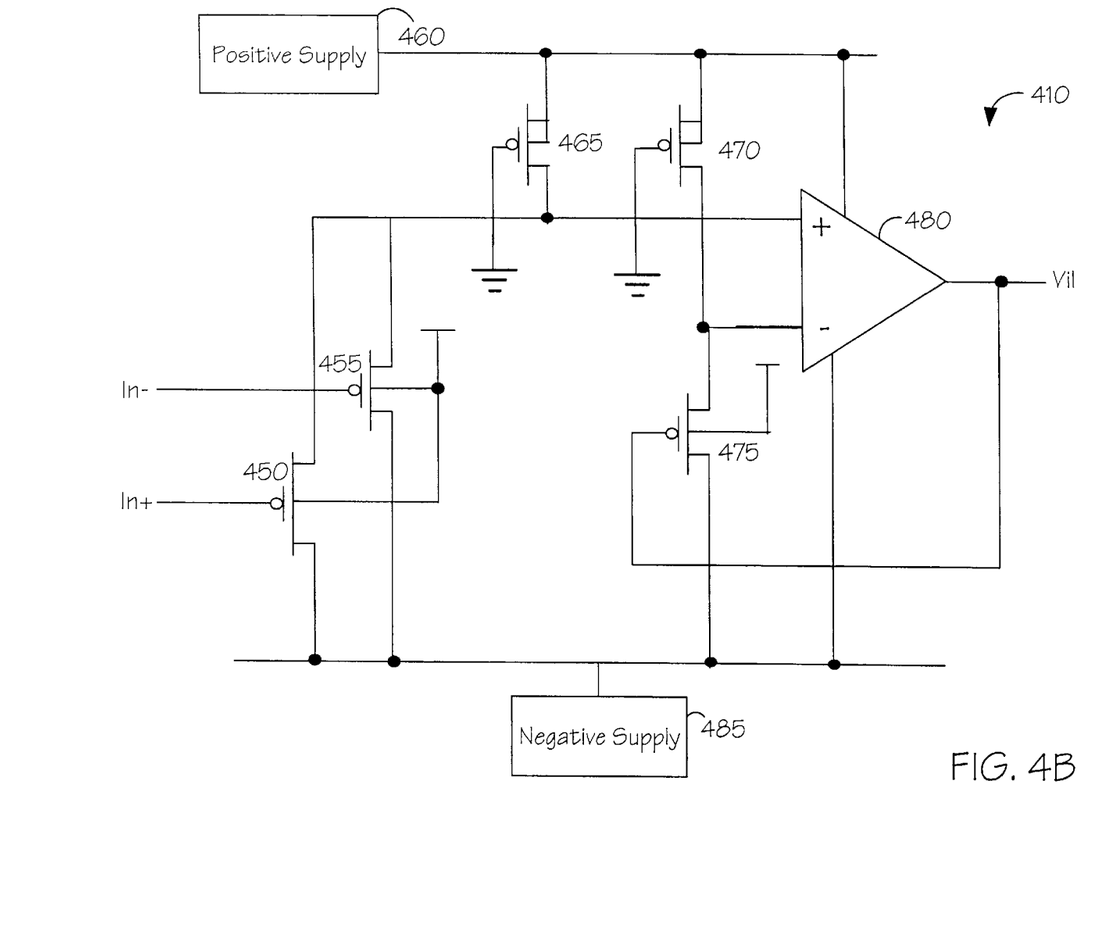
FIG. 4B depicts an exemplary embodiment of circuitry for producing a negative voltage excursion in accordance with the present invention.

Referring now to FIGS. 4A and 4B, exemplary embodiments for producing the common mode positive and negative voltage excursions of the differential inputs is shown. In FIG. 4A, circuitry 400 for producing a positive voltage excursion of the external differential inputs is shown. FIG. 4B shows circuitry 410 for producing the negative voltage excursion of the differential inputs. Circuitry 400 and 410 may be included within the input common mode voltage and amplitude sensor 255 of the present invention and shown in FIG. 2. An advantageous aspect of an embodiment of the present invention is the ability to use circuitry 400 and 410, working off one differential input, to sense the excursions for a set of parallel differential inputs as the common mode voltage and the differential amplitude may be identical for all inputs.

Circuitry 400, shown in FIG. 4A, may include an amplifier 420 and a transistor 425, 430 coupled to each differential input, respectively. Transistors 435, 440 may be equal sized and perform as a leaker, thus each may be made with a long channel. Transistor 445 may replicate transistor 425 or transistor 430. Thus, the gate drive of transistor 445 may be identical to the positive voltage extreme (Vih) of the differential inputs driving the transistors 425, 430 acting as source followers. Circuitry 400 employs n-channel MOS devices, however in alternative embodiments, p channel MOS devices, CMOS devices, and bipolar junction transistors may be employed.

In one embodiment of the invention, a positive supply voltage of VCC (approximately 2.5 volts) is utilized for circuitry 400 similar to controlled voltage source 315 of FIG. 3. In an alternate embodiment of the invention, a positive supply voltage higher than VCC may be utilized if a headroom voltage issue exists between the VCC and the differential input levels of circuitry 400. A boosted voltage may be obtained utilizing conventional charge pump circuitry.

Circuitry 410 shown in FIG. 4B may operate, in a similar fashion as circuitry 400 in FIG. 4A, to provide a negative voltage excursion of the differential inputs. Circuitry 410 includes an amplifier 480, transistors 450, 455 coupled to each of the differential inputs respectively. Transistors 450–475 may be p channel MOS devices in one embodiment of the invention. A positive supply voltage 460 of VCC and a negative supply 485 may be utilized for circuitry 410 to provide a negative voltage excursion. A pumped negative supply voltage 485 may be required in some applications if a headroom voltage issue exists. If a headroom voltage problem does not exist, negative supply voltage may represent a ground.

The voltage Vamp as shown in FIG. 2 may be produced by subtracting Vil from Vih, thus, subtracting the negative voltage excursion from the positive voltage excursion. A subtract circuit may be employed to produce Vamp utilizing active circuitry based around a high gain differential amplifier and resistor networks. It should be understood that various types of subtract circuits may be utilized in accordance with the present invention without departing from the scope and spirit of the present invention.

Figure 5:
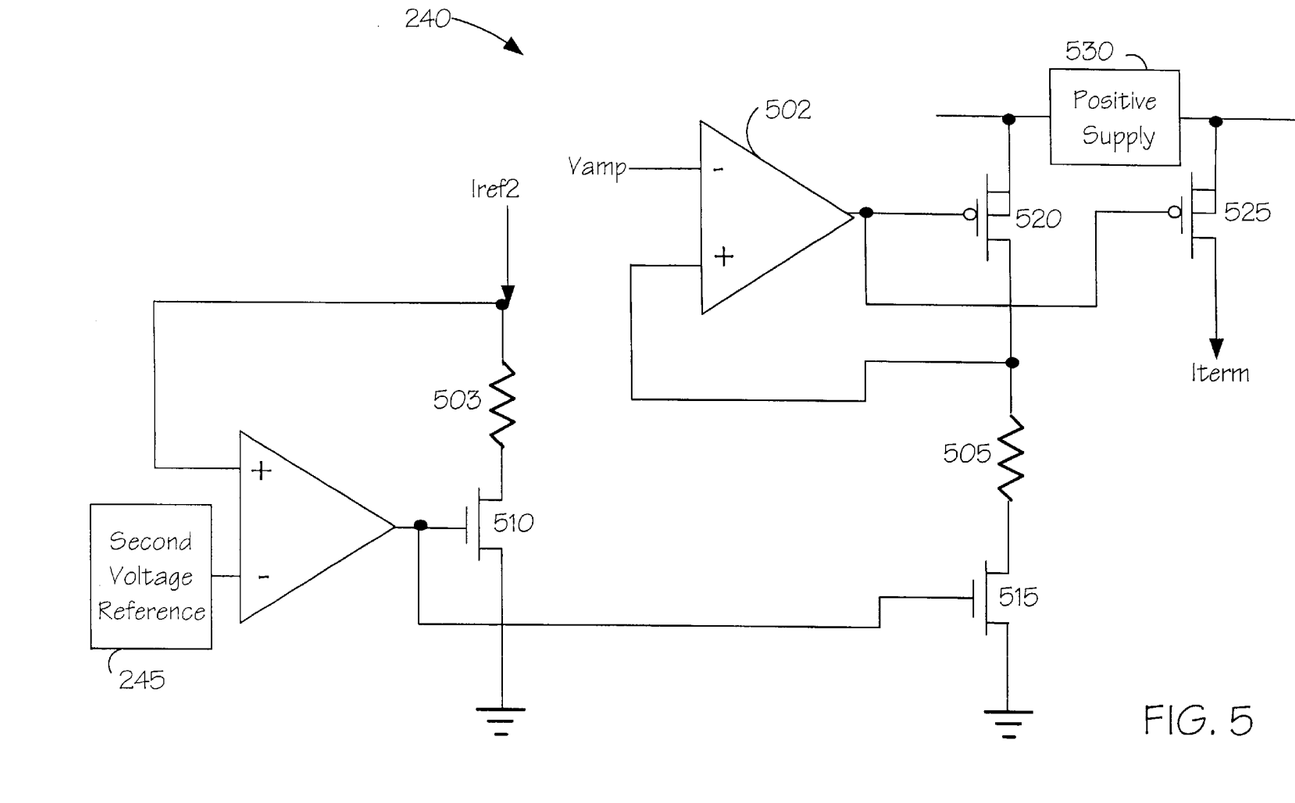
FIG. 5 depicts an exemplary embodiment of a resistor mirror and termination current generator of the present invention.

Referring to FIG. 5, an exemplary embodiment of a resistor mirror and termination current generator 240 of the present invention is shown. Resistor mirror and termination current generator 240 may include an amplifier 502 with a voltage Vamp coupled to the negative terminal. In a preferred embodiment of the invention, resistor mirror and termination current generator 240 is placed in close proximity to differential inputs 230 of FIG. 2 where the termination resistance is being implemented. It should be understood by those with ordinary skill in the art that multiple types of resistor mirror circuits are available and would not depart from the scope and spirit of the present invention.

Resistor mirror and termination current generator 240 may operate to produce a replica resistance of the reference resistance 210 of FIG. 2. Replica resistance includes resistor 503 and the resistance of n channel MOS transistor 510. The replica resistance may be mirrored to a mirrored resistance which includes resistor 505 and the resistance of n channel MOS transistor 515.

In one embodiment of the invention, transistors 510 and 515 should be kept deep in a linear region of operation as this ensures that the transistor operates in a manner closest to a linear resistor and is most accurate for resistor mirroring. To achieve this in a practical example, the gate input of transistors 510 and 515 may be taken as high as possible in relation to their source-drain voltages. In order to prevent transistors 510 and 515 from becoming impossibly big, Iref2 may be scaled many times smaller than Iref1 in the current mirror of FIG. 3. To improve the linearity of the resistor mirroring of transistor 510 to transistor 515, resistors 503 and 505 may be selected to account for most of the termination resistance value. Scaling may occur in Iref2 to Iref1 of FIG. 3, and scaling may also occur in the value of the second voltage reference 245 of FIG. 5 to the value of the first voltage reference 220 of FIG. 2. In addition, scaling may also occur in the value of the replica resistance of resistor 503 plus transistor 510 to the value of the mirrored resistance of resistor 505 plus transistor 515

The differential input swing amplitude (Vamp) may be placed across the mirrored resistance of resistor 505 and transistor 515. This arrangement may generate a current through transistor 520 which may be identical to or a scaled version of the desired termination resistance current Iterm. This may allow p-channel MOS transistor 520 to mirror termination current (Iterm on FIG. 5) to p-channel MOS transistor 525 for delivery to dummy termination device and gate control generator 260 of FIG. 2. In one embodiment of the invention, a positive supply voltage 530 higher than VCC may be utilized, thus the mirrored resistance may be scaled n times higher than the replica resistance to reduce the load on positive supply voltage 530. Thus, transistor 525 delivers a termination current Iterm that may be n times smaller than the Iterm required. However, dummy termination device and gate control generator 260 may be scaled also to compensate for all previous scaling.

Figure 6:
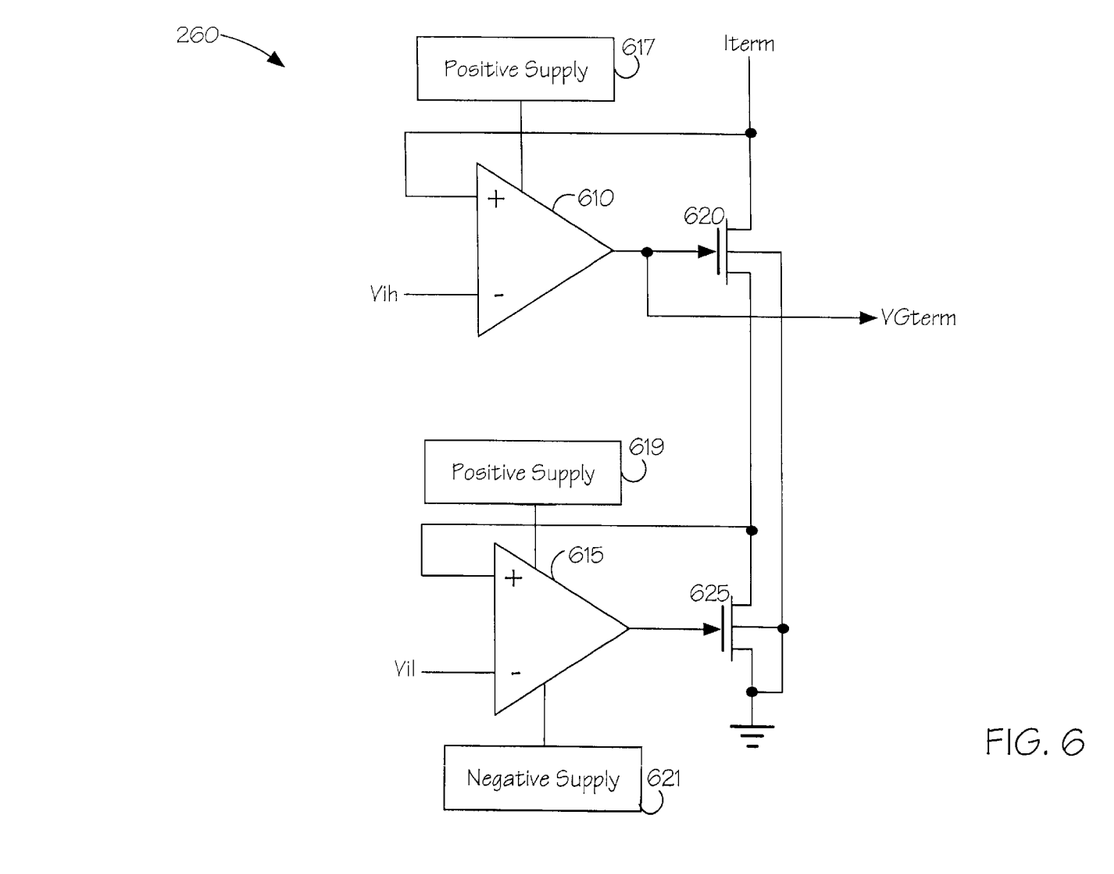
FIG. 6 depicts an exemplary embodiment of a dummy termination device and gate control generator of the present invention.

Referring now to FIG. 6, an embodiment of a dummy termination device and gate control generator 260 of the present invention is shown. Dummy termination device and gate control generator 260 may include a replica resistance device similar to a programmable resistance device. A similar voltage may be applied across the replica resistance device (approximately Vamp) as the voltage applied across the programmable resistance device. In one embodiment, replica resistance device may be a n channel MOS transistor 620. Dummy termination device 260 may further include an n channel MOS transistor 625 and two amplifiers 610, 615. First amplifier 610 may operate with a higher positive supply voltage 617 as described with respect to FIG. 4A, where second amplifier 615 may operate from a negative supply voltage 621 as described with respect to FIG. 4B. First amplifier 610 and second amplifier 615 may control the voltage levels at the drain and source of n channel MOS transistor 620 to be the positive and negative voltage excursions of the input differential signals.

The termination current Iterm produced by resistor mirror and termination current generator 240 of FIG. 2 is supplied to the drain of transistor 620, the dummy termination resistance. Iterm may be developed across a desired resistance (the mirrored resistance of FIG. 5) and with Vamp across transistor 620, the gate control of transistor 620 is the gate control required for transistor 225 to make it equal in resistance to the external reference resistor 210 of FIG. 2.

If the current Iterm is scaled down n times to reduce the load on the positive supply voltage, then the device geometry of transistor 620 may be scaled to that of transistor 225 of FIG. 2 according to the same ratio. Further, the gate control of transistor 620 may maintain transistor 620 in a linear region. Thus, since Vih could be at the positive supply voltage level, the output of amplifier 610 may swing to a high of near the value of the higher positive supply voltage 617. In order to ensure this condition, amplifier 610 may operate from the higher positive supply voltage 617.

In one embodiment of the invention, dummy termination device and gate control generator 260 may supply the gate control for a transistor 225 with dynamic inputs. In an alternative embodiment, dummy termination device and gate control generator 260 may supply the gate control of a transistor with static inputs. An advantageous aspect of the dummy termination device and gate control 260 is the ability to adjust in real-time. This may provide a gate control to ensure a termination resistance that is more accurate during continuous operation. Further, apparatus 200 of the present invention may not require a refresh function during operation of the apparatus 200 as implemented in some digital solutions.

An advantageous aspect of the apparatus 200 and dummy termination device 260 of the present invention is the ability of the programmable termination resistance to reflect the resistance of a reference resistance throughout a differential input switching operation. A programmable on-chip resistance may be maintained to provide a constant resistance for differential input common mode voltage changes. Further, a programmable on-chip termination device may provide a constant resistance over changes in an amplitude of an input differential swing.

This may be accomplished by maintaining transistor 225 in a linear region. In an exemplary LVDS operation, the maximum amplitude of the differential input (single-ended swing) is 400 milliVolts peak-to-peak. Thus the body-bias effect of transistor 225 may undergo a 200 millivolt change during switching which may minimally effect the termination resistance of transistor 225.

Figure 7:
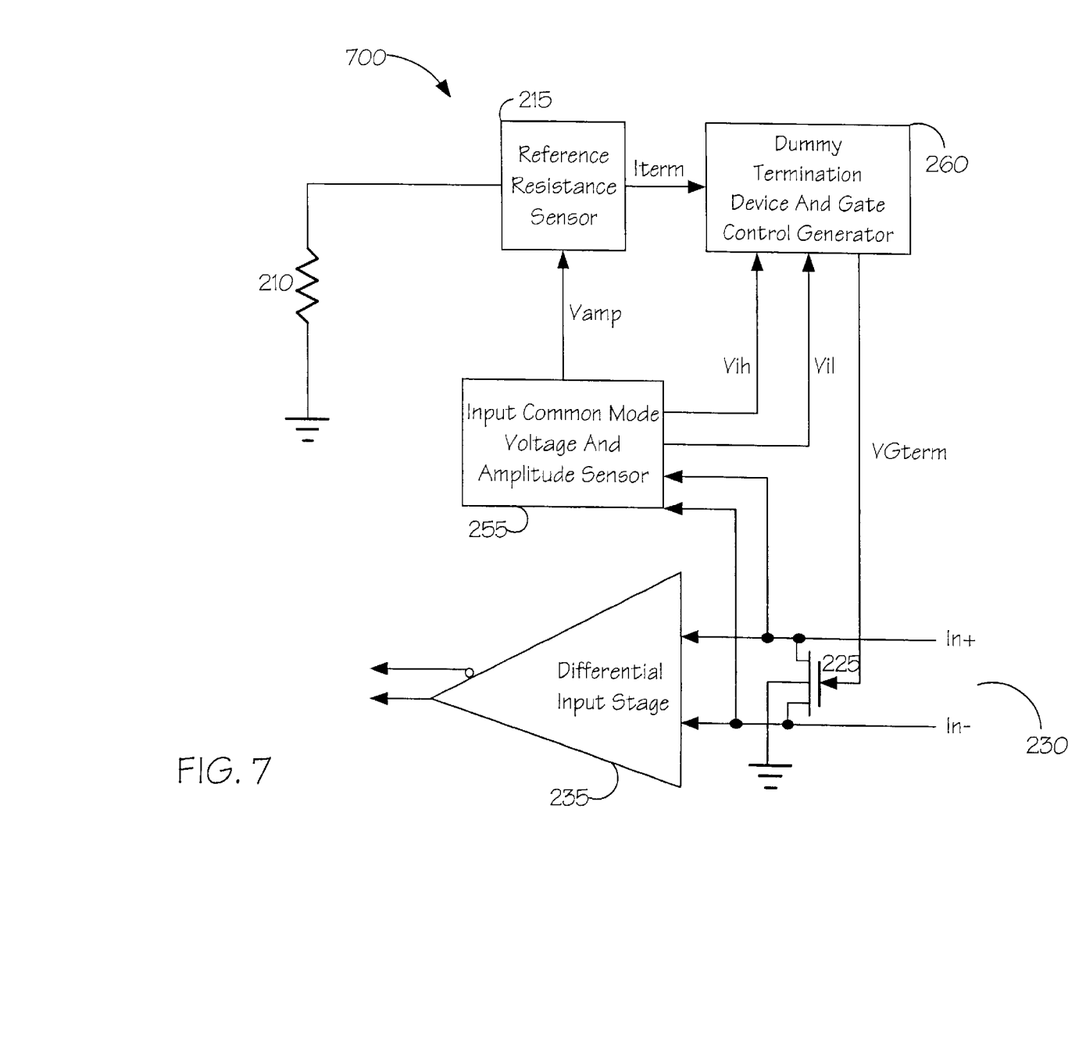
FIG. 7 depicts an alternative embodiment of an apparatus for producing a programmable on-chip resistance.

Referring now to FIG. 7, an alternative embodiment of an apparatus 700 for producing a programmable on-chip termination resistance is shown. Apparatus 700 is substantially similar to apparatus 200 of FIG. 2, however this embodiment of the invention may not require a first voltage reference 220, second voltage reference 245 and resistor mirror termination circuit 240 of FIG. 2. In this alternative embodiment of the present invention, the voltage Vamp may be inserted into amplifier 300 of the external reference resistor sensor 215 as shown in FIG. 3. This may produce a current Iterm to dummy termination device and gate control generator 260. Input common mode voltage and amplitude sensor 255 and dummy termination device and gate control generator 260 operate in a similar fashion as described with respect to FIG. 2 to produce a programmable on-chip resistance based upon the detected resistance of external reference resistor 210. In this alternative embodiment, it may be preferable to place the external reference resistor 110 close to a single set of differential inputs 130 to remove a mirroring requirement.

It should be understood by those with ordinary skill in the art that FIGS. 2–7 describe embodiments of circuitry to produce a programmable on-chip resistance. Yet, other devices and circuitry may be utilized to achieve a similar result without departing from the scope and spirit of the present invention. For example, other types of transistors may be employed than those disclosed in the description including both n channel and p channel MOS devices, CMOS devices, and bipolar junction transistors.

Further, although the invention has been described with a certain degree of particularity, it should be recognized that elements thereof may be altered by persons skilled in the art without departing from the spirit and scope of the invention. It is believed that the method and apparatus for the present invention and many of its attendant advantages will be understood by the foregoing description, and it will be apparent that various changes may be made in the form, construction, and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A method of controlling a resistance of a programmable resistance device, comprising:
    coupling a replica resistance device with said programmable resistance device, said replica resistance device being similar to said programmable resistance device;
    applying a similar voltage across said replica resistance device and said programmable resistance device;
    acquiring a control voltage from a terminal of said replica resistance device; and
    connecting said control voltage from said replica resistance device to said programmable resistance device, wherein said control voltage is capable of adjusting a resistance of said programmable resistance device, and wherein said control voltage has a magnitude that is dependent upon a resistance of a reference resistance.

2. The method as claimed in claim 1, wherein said programmable resistance device is a first transistor.

3. The method as claimed in claim 2, wherein said replica resistance device is a second transistor.

4. The method as claimed in claim 3, wherein said first transistor and said second transistor are MOS transistors.

5. The method as claimed in claim 4, wherein said control voltage from said terminal of said replica resistance device is a gate voltage of said second transistor.

6. The method as claimed in claim 5, wherein said gate voltage from said second transistor is applied to a gate of said first transistor.

7. The method as claimed in claim 1, wherein said similar voltage is a differential input swing amplitude voltage.

8. An apparatus, comprising:
    means for providing a differential input swing amplitude voltage across a replica resistance device;
    current receiving means coupled to said replica resistance device, said current receiving means accepting a current value indicative of a resistance value of a reference resistance; and
    means for controlling a resistance of a programmable resistance device, said means for controlling coupled to said replica resistance device; wherein a voltage approximately equal to said differential input swing amplitude voltage is applied across said programmable resistance device; said means for controlling being reflective of said current value to provide a control to said programmable resistance device such that a resistance of said programmable resistance device is approximately equal to said resistance value of said reference resistance.

9. The apparatus as claimed in claim 8, wherein said replica resistance device is a first transistor.

10. The apparatus as claimed in claim 9, wherein said programmable resistance device is a second transistor.

11. The apparatus as claimed in claim 10, wherein said first transistor and second transistor are MOS transistors.

12. The apparatus as claimed in claim 11, wherein said control is a gate voltage of said first transistor.

13. The apparatus as claimed in claim 12, wherein said gate voltage of said first transistor is coupled to a gate of said second transistor.

14. The apparatus as claimed in claim 11, wherein a voltage approximately equal to a positive voltage excursion is applied to a drain of said first transistor.

15. The apparatus as claimed in claim 11, wherein a voltage approximately equal to a negative voltage excursion is applied to a source of said first transistor.

16. An apparatus for controlling a programmable resistance, comprising:
    a transistor,
    means for applying a voltage approximately equal to a positive voltage excursion to a drain of said transistor;
    means for applying a voltage approximately equal to a negative voltage excursion to a source of said transistor; and
    a programmable resistance device coupled to a gate voltage of said transistor, wherein a similar voltage is applied across each of said programmable resistance device and said transistor and a current entering said drain of said transistor is indicative of a resistance value of a reference resistance, said gate voltage being reflective of said current such that said programmable resistance device has a resistance approximately equal to said resistance value of said reference resistance.

17. The apparatus as claimed in claim 16, wherein said programmable resistance device is a second transistor.

18. The apparatus as claimed in claim 17, wherein said transistor and said second transistor are MOS transistors.

19. The apparatus as claimed in claim 18, wherein said gate voltage applied to said second transistor maintains said second transistor operating in a linear region.

20. The apparatus as claimed in claim 16, wherein said similar voltage is a differential input swing amplitude voltage.

21. A method of controlling a resistance of a first MOS transistor, comprising:

coupling a second MOS transistor with the first MOS transistor;

applying a similar voltage across the second MOS transistor and the first MOS transistor;

acquiring a control voltage from a terminal of the second MOS transistor, wherein the control voltage is a gate voltage of the second MOS transistor; and applying the control voltage to the first MOS transistor, wherein the control voltage is capable of adjusting a resistance of the first MOS transistor, the control voltage of the second MOS transistor being dependent upon a resistance of a reference resistance.

* * * * *